(12) United States Patent
Higuchi

(10) Patent No.: US 7,131,087 B2
(45) Date of Patent: Oct. 31, 2006

(54) MULTI-CYCLE PATH ANALYZING METHOD

(75) Inventor: Hiroyuki Higuchi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 406 days.

(21) Appl. No.: 10/705,847

(22) Filed: Nov. 13, 2003

(65) Prior Publication Data

US 2004/0098685 A1 May 20, 2004

(30) Foreign Application Priority Data

Nov. 18, 2002 (JP) .............................. 2002-334069

(51) Int. Cl.
G06F 9/45 (2006.01)
G06F 17/50 (2006.01)
(52) U.S. Cl. ............................................. 716/6; 716/3
(58) Field of Classification Search .............. 716/1–19, 716/3, 6; 703/13–17, 19
See application file for complete search history.

(56) References Cited

U.S. PATENT DOCUMENTS

| | | | | |
|---|---|---|---|---|
| 5,191,541 | A * | 3/1993 | Landman et al. ............... | 716/6 |
| 6,053,949 | A * | 4/2000 | Takai et al. .................... | 703/15 |
| 6,075,936 | A * | 6/2000 | Mori et al. ..................... | 703/15 |
| 6,442,722 | B1 * | 8/2002 | Nadeau-Dostie et al. ... | 714/731 |
| 6,615,392 | B1 * | 9/2003 | Nadeau-Dostie et al. ...... | 716/5 |
| 6,658,635 | B1 * | 12/2003 | Tanimoto ........................ | 716/6 |
| 2002/0199161 | A1 * | 12/2002 | Yamamoto et al. ............ | 716/6 |
| 2003/0225559 | A1 * | 12/2003 | Sharma ........................ | 703/16 |
| 2003/0229871 | A1 * | 12/2003 | Nakae et al. ................... | 716/6 |

OTHER PUBLICATIONS

H. Higuchi, "An Implication-based Method to Detect Multi-Cycle Paths in Large Sequential Circuits", In Proceedings of the 39th ACM/IEEE Design Automation Conference, pp. 164-169, 2002.
K. Nakamura, et al., "Waiting False Path Analysis of Sequential Logic Circuits for Performance Optimization", IEEE/ACM ICCAD 98 pp. 392-395, 2002.
S. Davadas et al., "Logic Synthesis", p. 236-241, McGraw-Hill, 1994.

* cited by examiner

Primary Examiner—Jack Chiang
Assistant Examiner—Nghia M. Doan
(74) Attorney, Agent, or Firm—Staas & Halsey LLP

(57) ABSTRACT

An analysis of a circuit to be analyzed is made in correspondence with the name of each element which includes a cell configuring the circuit to be analyzed, and the meaning or the relationship of a signal to a terminal of each element, and a determination of whether or not a path from a starting point to an end point is a multi-cycle path is made by using a result of the analysis, thereby providing an analyzing method that can also cope with the use of a gated clock, and an increase in the scale of a circuit, has a short processing time, and can accurately detect a multi-cycle path.

12 Claims, 20 Drawing Sheets

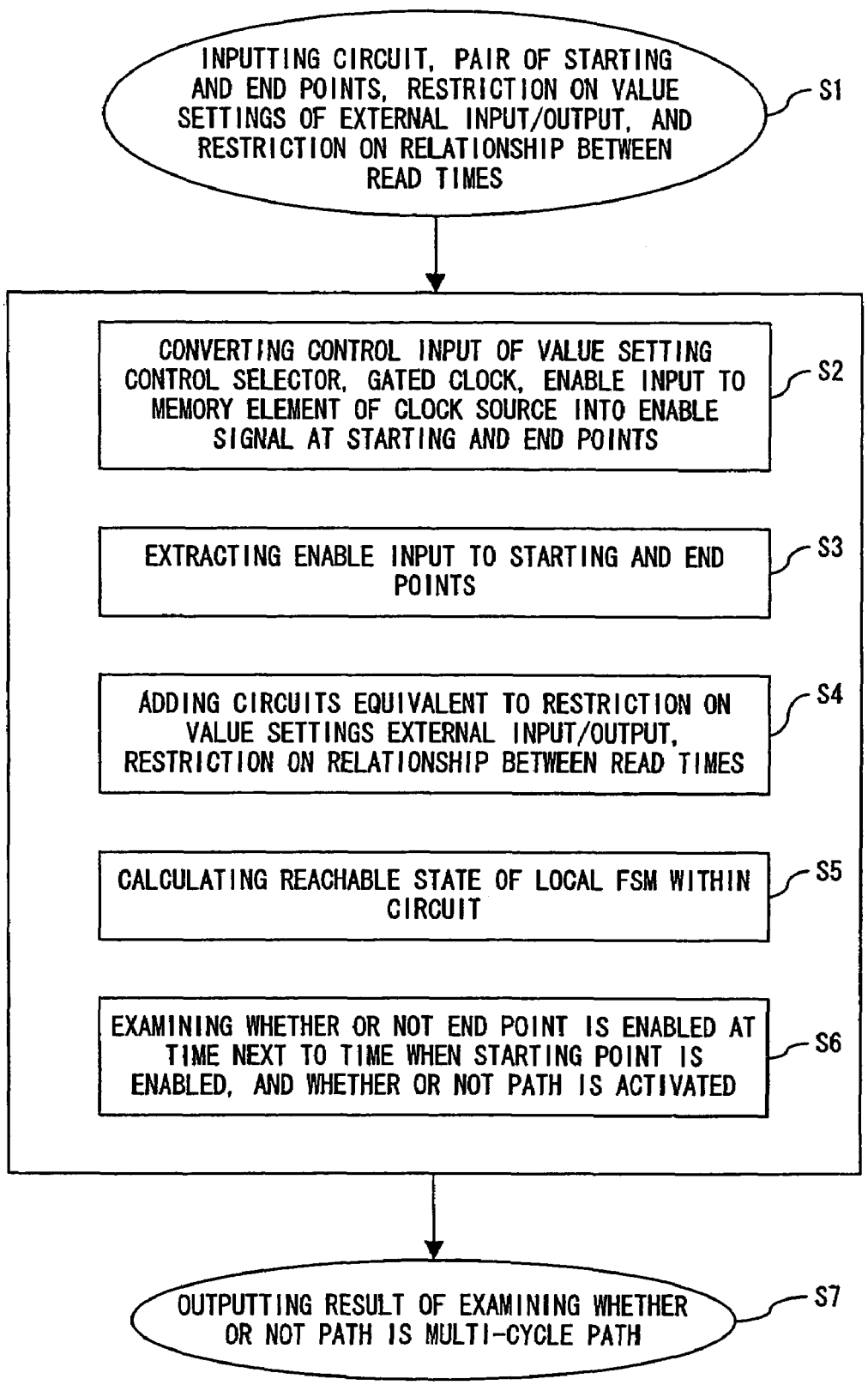
F I G. 2

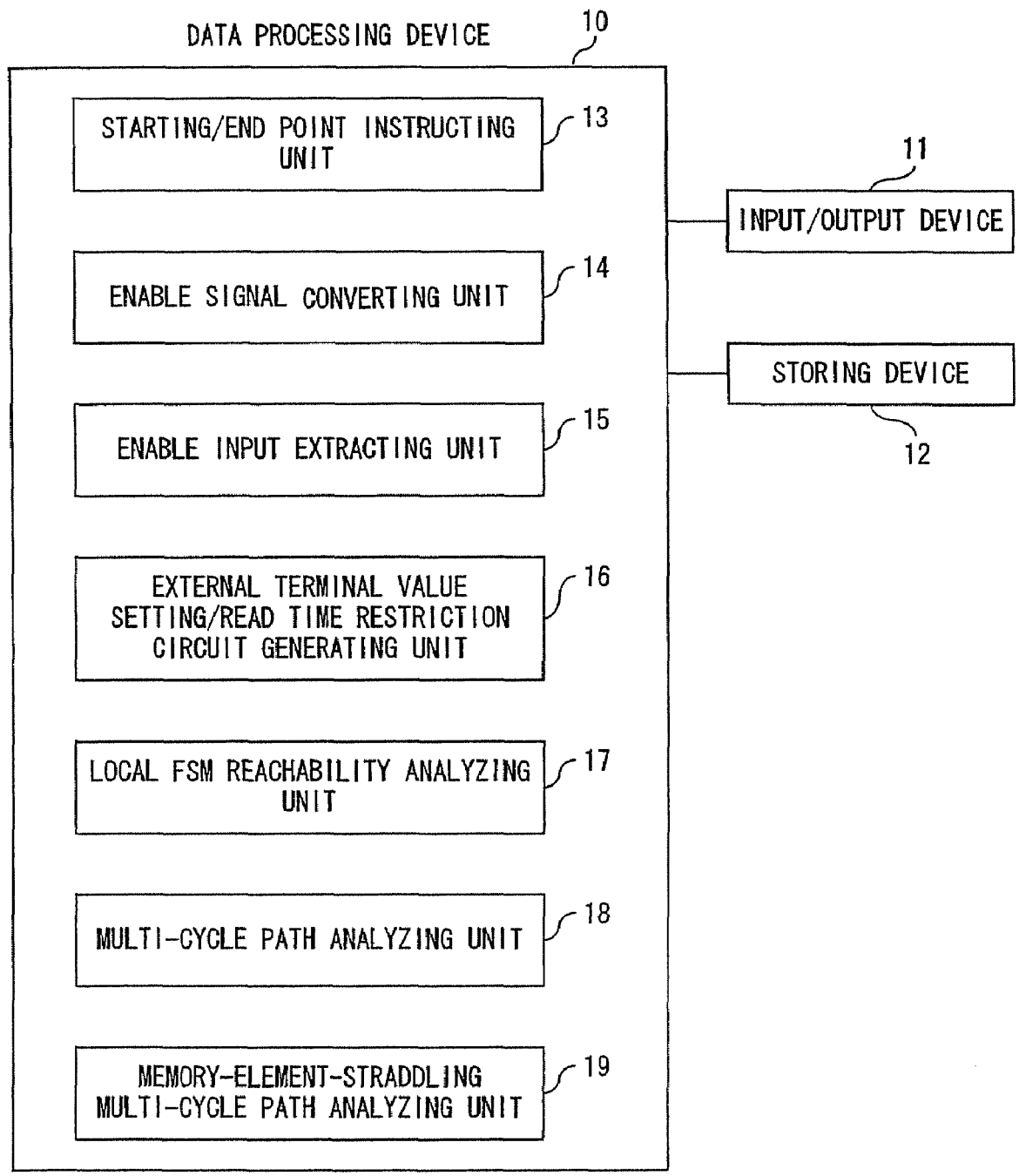
F I G. 4

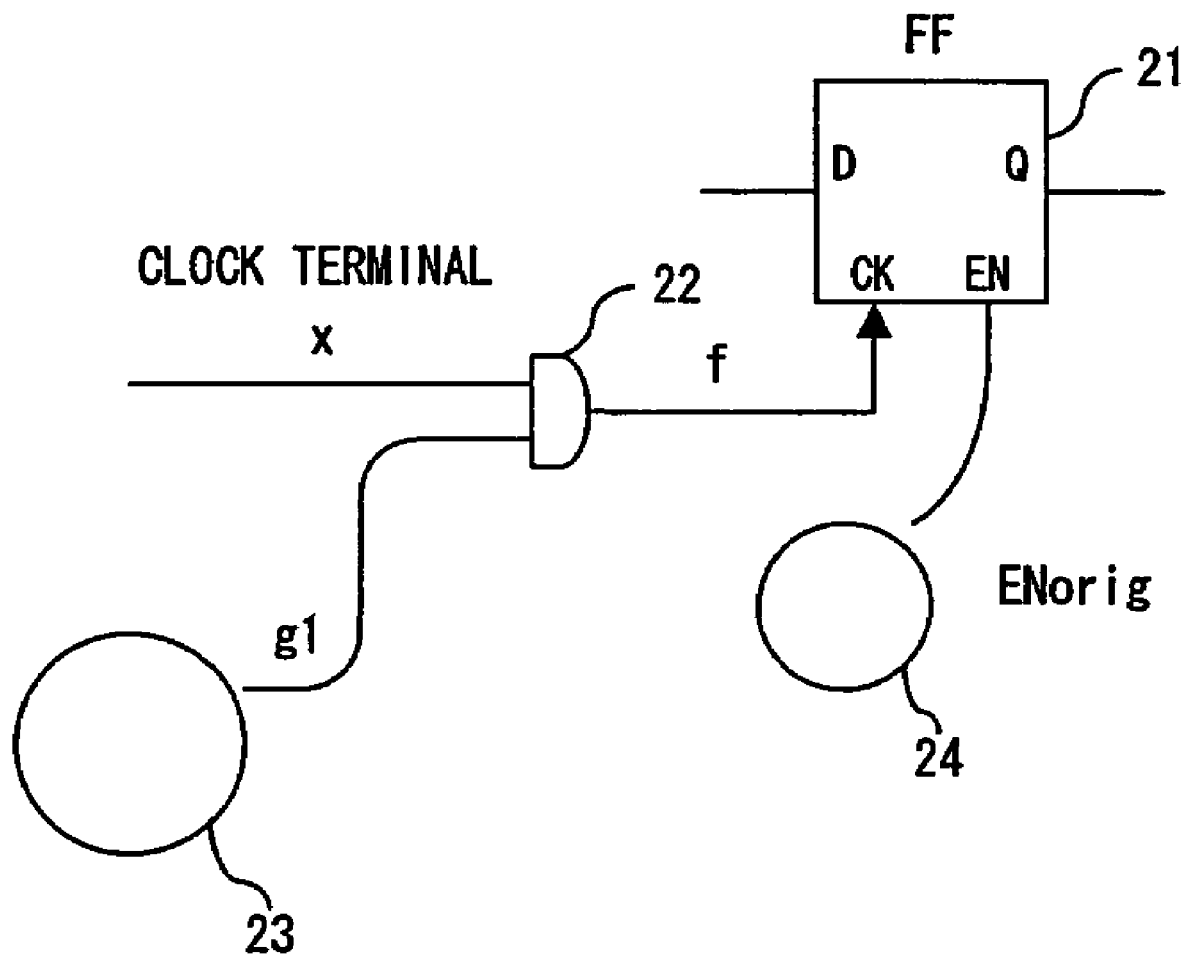
F I G. 7

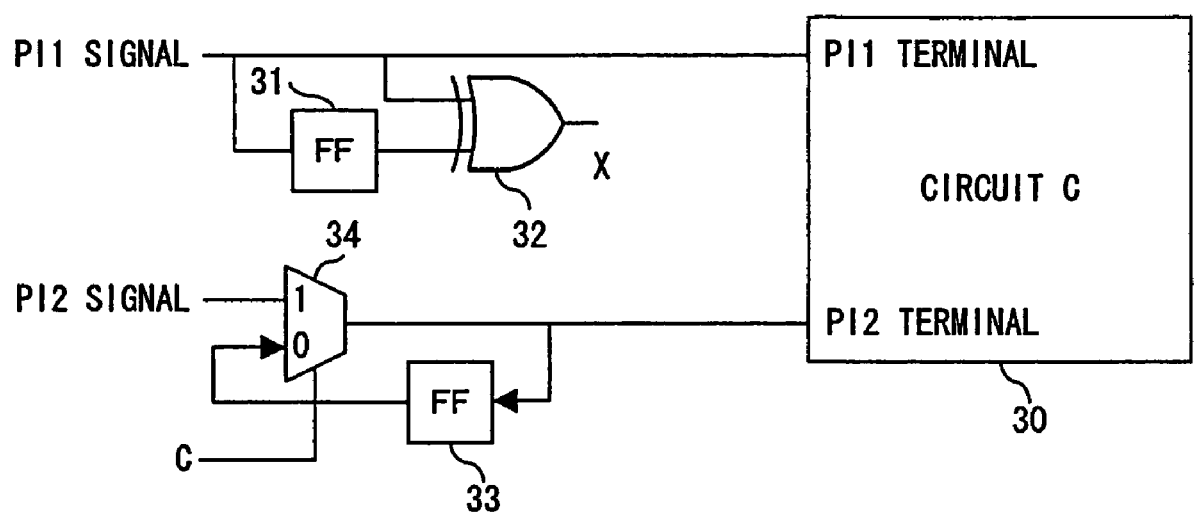
F I G. 1 0

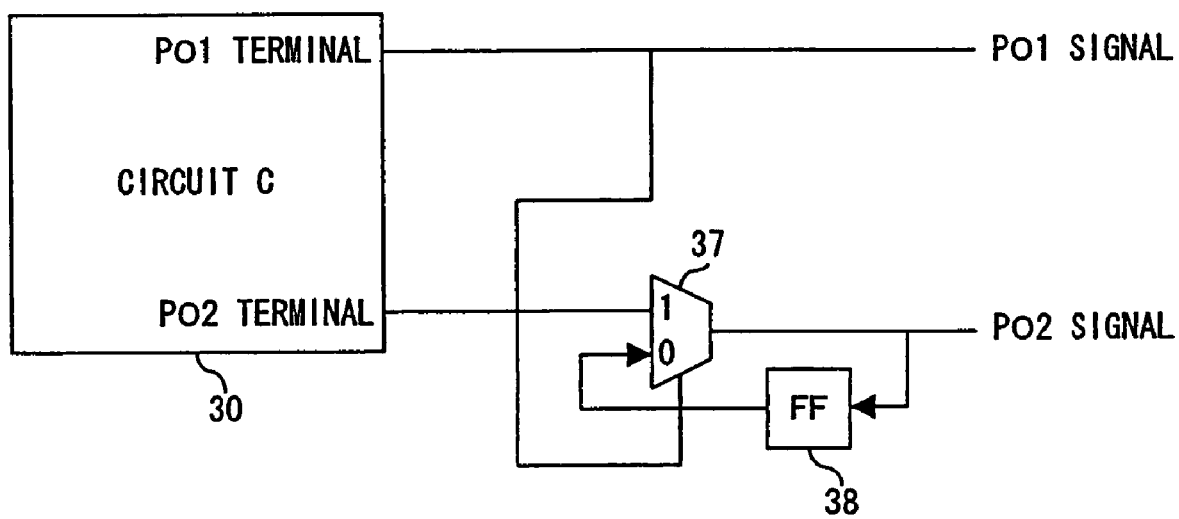
F I G. 1 2

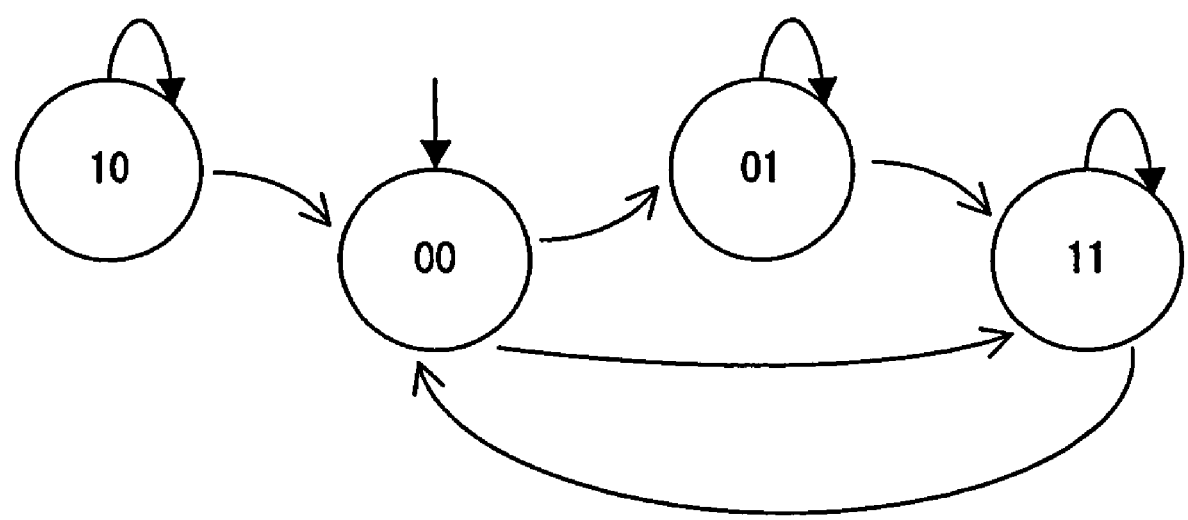
F I G. 1 4

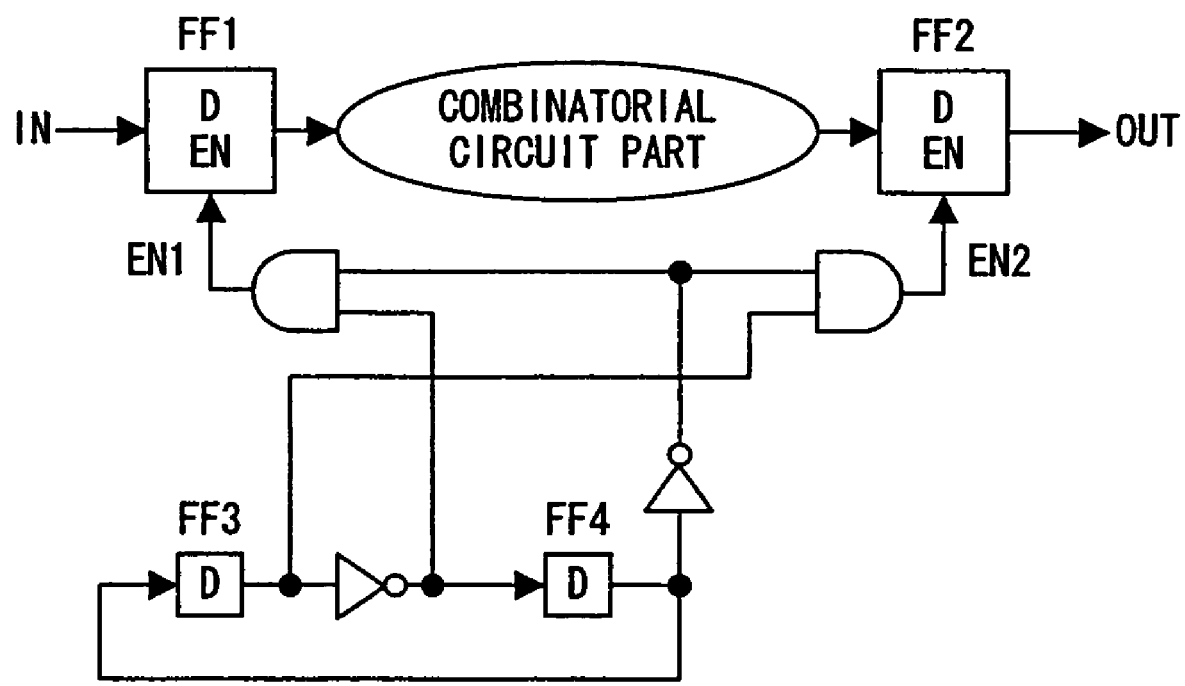
F I G. 1 7

MULTI-CYCLE PATH ANALYZING METHOD

BACKGROUND OF THE INVENTION

1. Field of the Invention

The present invention relates to a multi-cycle path analyzing method for detecting a multi-cycle path which can take 2 cycles or more for a signal to propagate from the starting point of the path to its end point, for example, among paths between two memory elements within a circuit to be analyzed in a timing analysis and logic verification of a digital circuit.

2. Description of the Related Art

A multi-cycle path in a digital circuit is a path that can take time of two cycles or more for a signal propagate from a memory element at a starting point to that at an end point, for example, between the two memory elements. Generally, a path between memory elements is handled as a single cycle path on which a signal propagates in one cycle.

If a delay between the memory elements becomes large, a design becomes difficult when the path between the memory elements is handled as a single cycle path. By detecting a multi-cycle path which may take two cycles or more from the starting point of the path to its end point, restrictions are eased to be able to facilitate a design.

Conventionally, not many techniques that are effective for a multi-cycle path analysis exist, and normally, a human being specifies a multi-cycle path at the time of design.

The following document exists as a conventional technique in the case where a pure logic circuit is targeted.

H. Higuchi: An Implication-based Method to Detect Multi-Cycle Paths in Large Sequential Circuits, IEEE/ACM Design Automation Conf. pp. 164–169, 2002

However, in an actual normal digital circuit, logic gates are mapped by cells of a cell library. Therefore, two clocks or more exist, and a gated clock is used. Accordingly, it has been difficult to automatically detect a multi-cycle path in an actual digital circuit.

Additionally, there has been a method calculating the state transition of a circuit, namely, reachability from the initial state by recognizing the entire circuit as one finite state machine, and using the reachability so as to detect a multi-cycle path. This method is described by the following document.

K. Nakamura, et al., "Waiting False Path Analysis of Sequential Logic Circuits for Performance Optimization", IEEE/ACM ICCAD 98, pp. 392–395

However, since an entire circuit is handled as one finite state machine with this method, the scale of a finite state machine becomes enormous if the circuit becomes complex. Therefore, this method is not always effective as a practical method for detecting a multi-cycle path.

Furthermore, with a conventional method detecting a multi-cycle path by altogether recognizing paths between two memory elements, it cannot be determined whether or not a targeted multi-cycle path is actually activated, namely, whether or not a change in the value of a memory element at a starting point propagates to a memory element at an end point over the path, or whether or not a change in the value of a memory element at a point other than the starting point propagates to the memory element at the end point.

With an increase in the scale of a circuit in recent years, a multi-cycle path analysis has become complex, and its processing time has become large. Besides, if a clock is complex such as in the case where a gated clock is used, an influence of the clock cannot be accurately determined, and there are difficulties in the detection of a multi-cycle path.

Additionally, with a conventional method detecting a multi-cycle path by altogether recognizing paths between two memory elements, it is not examined whether or not a targeted multi-cycle path is actually activated. Therefore, an ability to detect a multi-cycle path is degraded.

Furthermore, if a multi-cycle path is specified by a designer at an early stage of design, the specification of the multi-cycle path is normally fixed, and a path the timing of which is strict is not actually specified at a stage after the design. As a result, a timing restriction is not satisfied. Besides, variations in a circuit delay in chip manufacturing tend to increase. However, since a timing restriction is fixed at the time of design, a product yield is degraded.

SUMMARY OF THE INVENTION

An object of the present invention is to provide a multi-cycle path analyzing method which can also cope with the use of a gated clock and an increase in the scale of a circuit, has a short processing time, and can accurately detect a multi-cycle path in view of the above described problems.

Another object of the present invention is to provide an analyzing method which improves an ability to detect a multi-cycle path by examining a path activation condition, and can also cope with variations in a product delay by examining the movability of a multi-cycle path even in the case where a multi-cycle path is specified at the time of design.

To achieve the above described objects, a multi-cycle path analyzing method according to the present invention, to detect a multi-cycle path that can take two cycles or more for a signal to propagate from a starting point of the path to its end point among paths within a circuit to be analyzed, comprises: analyzing a circuit to be analyzed in correspondence with the name of each element which includes a cell configuring the circuit to be analyzed, and/or the meaning and/or the relationship of a signal to a terminal of each element; and making a multi-cycle path determination of whether or not a path from a starting point to an end point is a multi-cycle path by using a result of the analysis.

Additionally, to achieve the above described objects, a multi-cycle path analyzing apparatus according to the present invention, to detect a multi-cycle path that can take two cycles or more for a signal to propagate from a starting point of the path to its end point among paths within a circuit to be analyzed, comprises: a circuit converting unit performing circuit conversion for making a multi-cycle path analysis in correspondence with the meaning of a signal to a terminal of each element which includes a cell configuring a circuit; and a multi-cycle path determining unit making a determination of whether or not a path from a starting point to an end point is a multi-cycle path by using a result of the circuit conversion.

Furthermore, to achieve the above described objects, a program according to the present invention for causing a computer, which makes an analysis of a multi-cycle path that can take two cycles or more for a signal to propagate from a starting point of a path to its end point among paths within a circuit to be analyzed, to execute a process, the process comprises: performing circuit conversion for a multi-cycle path analysis in correspondence with the meaning of a signal to a terminal of each element which includes a cell configuring a circuit; and making a determination of whether or not a path from a starting point to an end point is a multi-cycle path by using a result of the circuit conversion.

BRIEF DESCRIPTION OF THE DRAWINGS

FIG. 2 is a flowchart showing a fundamental process for detecting a multi-cycle path;

FIG. 4 is a block diagram showing the configuration of a data processing device for implementing a multi-cycle path analyzing method according to a preferred embodiment;

FIG. 7 explains a specific example of the process for performing conversion of a gated clock;

FIG. 10 explains a specific example (No. 1) of the conversion into the restriction circuit in FIG. 9;

FIG. 12 explains a specific example (No. 3) of the conversion into the restriction circuit in FIG. 9;

FIG. 14 explains a specific example of the process shown in FIG. 13;

FIG. 17 explains a specific example of a change in an enable signal;

DESCRIPTION OF THE PREFERRED EMBODIMENTS

Figure 1:
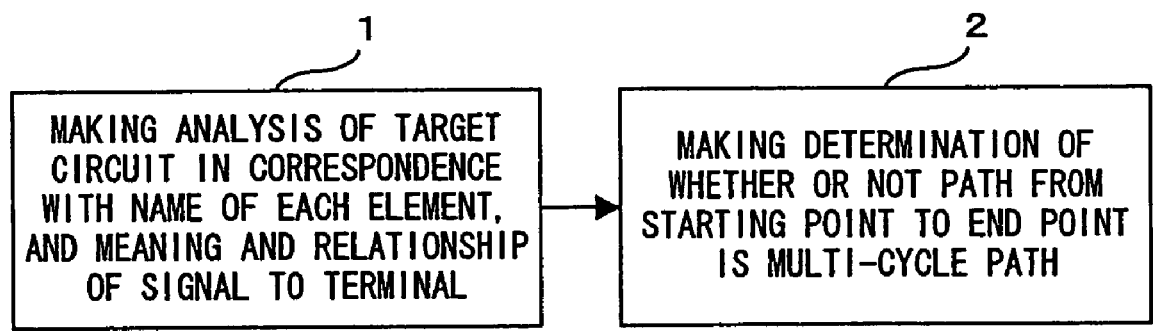
FIG. 1 is a block diagram showing the principle of a multi-cycle path analyzing method according to the present invention.

FIG. 1 is a block diagram showing the principle of a multi-cycle path analyzing method according to the present invention. This figure is a block diagram showing a method analyzing a multi-cycle path that may take two cycles or more for a signal to propagate from a starting point of a path to its end point among paths within a circuit to be analyzed.

In FIG. 1, in 1, an analysis of a circuit to be analyzed is made in correspondence with the name of each element which includes a cell configuring the circuit, and the meaning and/or the relationship of a signal to a terminal of the element, and in 2, a multi-cycle path determination of whether or not a path from a starting point to an end point is a multi-cycle path is made.

In a preferred embodiment according to the present invention, circuit conversion for a multi-cycle path analysis may be performed in correspondence with the meaning of a signal to a terminal of each element in the circuit analysis 1, and the multi-cycle path determination 2 may be made by using a result of the conversion.

In this case, circuit conversion for converting a signal, which can be converted into an enable signal to memory elements at starting and end points of the path among signals to the terminal of the element, into an enable signal can be performed, and a multi-cycle path determination can be also made depending on whether or not the value of a memory element can possibly change based on the value of the enable signal to the memory elements at the starting and the end points in the multi-cycle path determination 2.

Additionally, in the circuit conversion, circuit conversion for converting a selection control signal to a selector which controls the settings of values of memory elements at a starting point and an end point into an enable signal, circuit conversion for converting an enable signal to a memory element in a source of a clock into an enable signal to the memory elements at the starting and the end points when the source of the clock which drives the memory elements at the starting and the end points is a memory element, and circuit conversion for converting the driving clock into an enable signal by using clock gating information of the clock which drives the memory elements at the staring and the end points can be also performed.

Additionally, in a preferred embodiment, if all of the paths between the starting and end points of the path are inactive for the path which is determined not to be a multi-cycle path in the multi-cycle path determination made based on the value of an enable signal, the path can be also determined to be a multi-cycle path.

Furthermore, in a preferred embodiment, based on a condition for the relationship between a value setting signal to an external input terminal in a circuit, and a value read signal from an external output terminal, a restriction circuit corresponding to the condition can be added to a circuit to be analyzed in the circuit analysis 1, and the multi-cycle path determination 2 can be also made for the circuit to be analyzed after the addition. Besides, memory elements within the circuit can be classified into groups by the names of the respective memory elements, and the reachable state of a finite state machine represented by each of the groups can be calculated in the analysis 1, and the multi-cycle path determination 2 can be made by using a result of the calculation.

Furthermore, in a preferred embodiment, if one memory element or more exist on a path between memory elements at starting and end points of the path among paths determined to be a multi-cycle path, and if a multi-cycle path restriction is imposed in some of partial paths between two successive memory elements at the time of circuit design, it can be further examined whether or not the multi-cycle path restriction can be moved to a different partial path according to an enable signal to the memory elements at the starting and the endpoints.

Still further, as described above, information required for performing circuit conversion can be stored instead of actually performing circuit conversion in the analysis 1 of a circuit to be analyzed, and the multi-cycle path determination 2 can be made by using the stored contents.

Still further, a multi-cycle path analyzing apparatus according to a preferred embodiment comprises a circuit converting unit performing circuit conversion for the above described multi-cycle path analysis, and a multi-cycle path determining unit determining a multi-cycle path by using a result of the circuit conversion. Besides, the circuit converting unit can also perform circuit conversion for converting a signal which can be converted into an enable signal to memory elements at starting and end points of a path into an enable signal.

Still further, in a preferred embodiment, used as a program for implementing a multi-cycle path analyzing method is a program for causing a computer to execute a process, the process comprising: performing circuit conversion for a multi-cycle path analysis; and determining a multi-cycle path by using a result of the conversion.

As described above, according to the present invention, circuit conversion for a multi-cycle path analysis is performed, for example, in correspondence with the meaning of a signal to a terminal of each element configuring a circuit, and a multi-cycle path determination is made by using a result of the conversion.

FIG. 2 explains a fundamental process for detecting a multi-cycle path in a preferred embodiment according to the present invention. In this figure, firstly, in step S1, data required for a multi-cycle path detection processes input. As this data, a circuit to be detected, paths in the circuit, a pair of a memory element, for example, as a starting point and a memory element at an end point, to which a signal from the memory element at the starting point is input over the path, value settings of external input/output, a restriction on the relationship between times at which data is read from the memory elements at the starting and the end points, and the like are input. The value settings of external input/output, and the restriction on the relationship between the read times will be described later.

Processes from the next step S2 to step S6 are the essential processes for detecting a multi-cycle path. Firstly, in step S2, all of signals that can be converted into, by way of example, an enable signal to a memory element are converted into enable signals among various types of signals. In this preferred embodiment, multi-cycle path detection is made depending on values stored in the memory elements at the starting and the end points of a path within the circuit, for example, a change in the values of flip-flops. However, whether or not a change occurs in the values of flip-flops is fundamentally controlled according to the value of an enable signal. Therefore, multi-cycle path detection is made based on the value of an enable signal.

In step S2, a selection control input to a value setting control selector is first converted into an enable signal as a signal which can be converted into such an enable signal. The value setting control selector is a selector for controlling the settings of the values in flip-flops, for example, at the starting and end points as will be described later, and the selection control input to the selector is converted into an enable signal.

A second signal converted into an enable signal is a gated clock. A gated clock is given in the form where, for example, an AND gate is inserted between an original clock signal and a clock terminal of a flip-flop, and an output of the AND gate is determined based on a condition of an input to the AND gate.

For the third signal conversion, in the case where a memory element is further connected, for example, to a clock terminal of a flip-flop, and the memory element is used as a clock source, an enable signal to the memory element is converted into an enable input signal to a flip-flop at a starting or an end point.

In step S3, enable input signals to the memory elements at the starting and the end points including the signals converted in step S2 are extracted. Then, in step S4, circuits equivalent to the external input/output value settings described in step S1, and a restriction on the relationship between the read times at the starting and the end points are added. Also this process will be described later.

Then, in step S5, a local finite state machine (FSM) within the circuit is identified, and a detection process for counting up a reachable state from its initial state is executed. Also its details will be described later.

In step S6, it is examined whether or not the flip-flop at the end point is enabled, for example, at a time next to the time when the flip-flop at the starting point is enabled. If the flip-flop at the end point is enabled at the next time, it means that the signal reaches from the starting point to the end point in one cycle. Therefore, that path is not a multi-cycle path but a single-cycle path.

Additionally, in step S6, it is examined whether or not the path from the starting point to the end point is activated, namely, whether or not the signal from the starting point reaches the end point in one cycle. If all of the paths between the starting and the end points are not activated, it means that the path connecting the starting and the end points is a multi-cycle path.

With the above described processes, the fundamental process for detecting a multi-cycle path is terminated, and a result of the multi-cycle path determination is output in step S7. Here, the process for detecting a multi-cycle path is completed.

Figure 3:
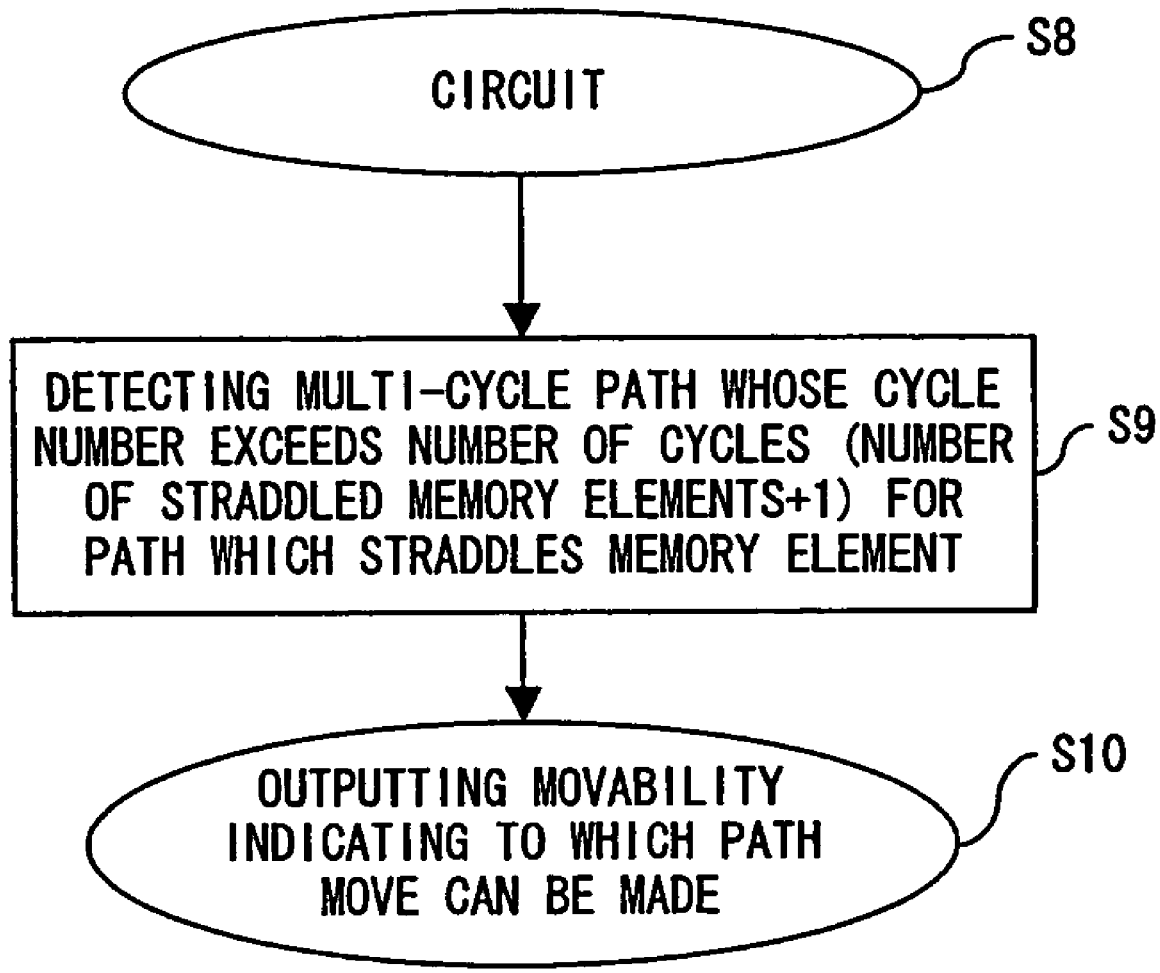
FIG. 3 is a flowchart showing a fundamental process for analyzing the movability of a multi-cycle path.

FIG. 3 is a flowchart showing a fundamental process for detecting the movability of a multi-cycle path, which examines whether or not a multi-cycle path restriction specified, for example, at the time of design can be moved on a multi-cycle path by examining whether or not a different memory element exists on the path between a memory element at a starting point and a memory element at an endpoint, namely, whether or not the path straddles a memory element, and by targeting the multi-cycle path that straddles such a memory element.

Firstly, in step S8, a circuit to be targeted is specified.

In step S9, a path which straddles a memory element is recognized as a detection target, and a multi-cycle path which exceeds the number of cycles (the number of straddled memory elements+1) on a path between a starting point and an end point is detected. For example, if one flip-flop exists on a path between a flip-flop at the starting point and a flip-flop at the end point, (the number of straddled memory elements+1) results in 2, and a multi-cycle path which exceeds two cycles, namely, a multi-cycle path which takes 3 cycles or more is detected.

Then, in step S10, movability such that the multi-cycle path can move to a path between which memory elements between the starting and the endpoints is output. If a multi-cycle path which straddles one memory element on the path and takes three cycles or more is detected as described above, a multi-cycle path restriction can be moved between the memory element on the path and the endpoint when a specified path is, for example, between the starting point and the memory element on the path in the case where the multi-cycle path specified, for example, at the time of design is either between the starting point and the memory element on the path or between the memory element on the path and the end point, and this movability is output in step S10.

FIG. 4 is a block diagram showing the configuration of a data processing device when the fundamental processes shown in FIGS. 2 and 3 are executed by using the data processing device, namely, a computer. In this figure, an input/output device 11 and a storing device 12 are connected to the data processing device 10. The input/output device 11 is intended to read circuit data, to input a user operation, to output multi-cycle path data resultant from detection, and the like. The storing device 12 is intended to store circuit data, an intermediate result of a process, and the like.

The data processing device 10 comprises a starting/end point, instructing unit 13 instructing a pair of starting and end points of a path for which a multi-cycle path analysis is to be made in a given circuit, an enable signal converting unit 14 executing the process in step S2 of FIG. 2, an enable input extracting unit 15 executing the process in step S3, an external terminal value setting/read time restriction circuit generating unit 16 executing the process in step S4, a local FSM reachability analyzing unit 17 executing the process in step S5, a multi-cycle path analyzing unit 18 executing the process in step S6, and a memory-element-straddling multi-cycle path analyzing unit 19 executing the process in step S9 of FIG. 3.

Figure 5:
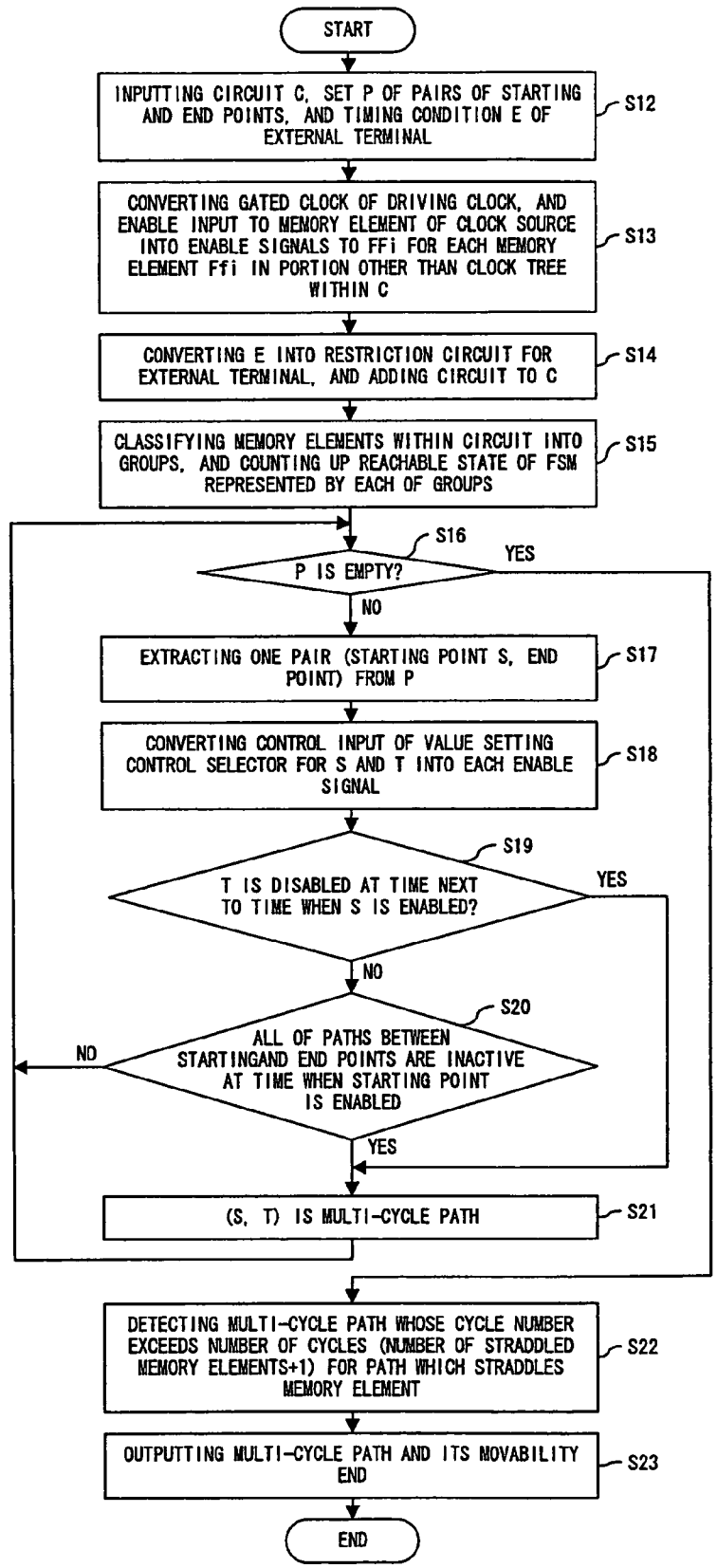
FIG. 5 is a flowchart showing the whole of a process for analyzing a multi-cycle path.

FIG. 5 is a flowchart showing the details of the process for analyzing a multi-cycle path in this preferred embodiment. The process shown in this figure is described in detail with reference to FIGS. 6 to 20 showing the details of a process in each step and specific examples of circuits.

Once the process is started in FIG. 5, a circuit C for which the analysis process is to be executed, a set P of pairs of starting and end points, and a timing condition E of an external terminal are first input in step S12. Examples of the timing condition E include a condition where the value of an external input B does not change during 5 clocks from when the value of an external input A changes, a condition where the value of an external output D is observed only after 3 clocks from when the value of A changes, and the like.

In step S13, a gated clock of a clock which drives each memory element in a portion (such as a logic operation unit only) other than a clock tree within the circuit C, by way of example, a flip-flop FFi, and an enable input to a memory element (within the clock tree), which is a clock source, are converted into enable signals of the FFi.

In this process, it is examined whether or not the clock which drives, for example, the flip-flop FFi in a portion other than the clock tree is a gated clock which masks a signal from the clock source according to a condition, and a circuit corresponding to a condition where the signal from the clock source is not masked is synthesized and converted into an enable signal ENgated of the FFi.

Additionally, if the clock source is a memory element, an enable input to the memory element is defined as an enable signal ENclksrc of the FFi unchanged. If the original enable input to the FFi is defined to be ENorig, an AND gate which uses these three enable signals as fan-in is generated, and its output is connected to an enable input of the FFi.

Figure 6:
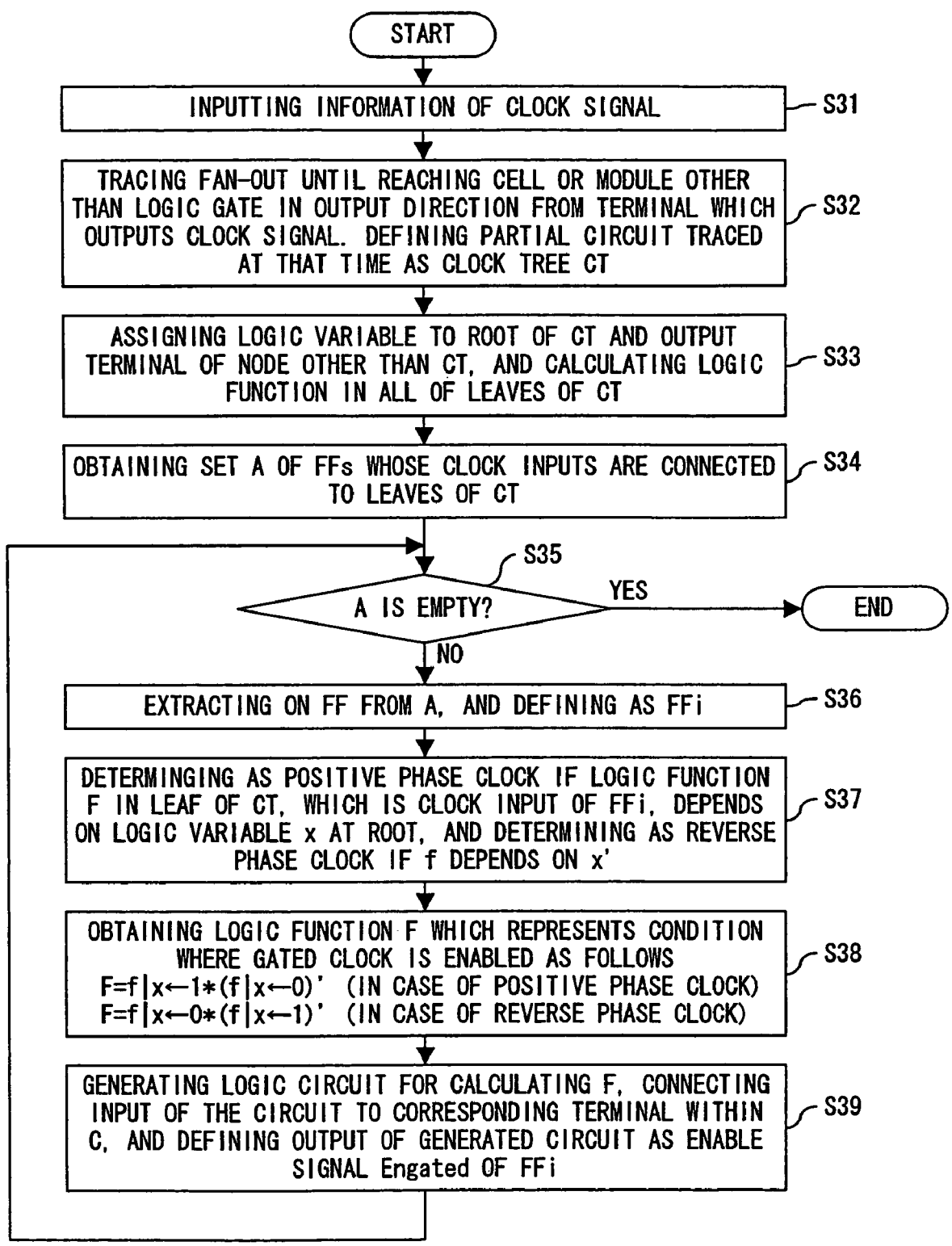
FIG. 6 is a flowchart showing the details of a process for performing conversion of a gated clock into an enable signal to a flip-flop.

FIG. 6 is a flowchart showing the details of the process in step S13. The process shown in this figure is described with reference to the specific examples of circuits shown in FIGS. 7 and 8.

Once the process is started in FIG. 6, information of a clock signal, in FIG. 7 information indicating that a signal x from a clock terminal is a clock signal is input. In step S32, an analysis of a clock tree CT is made.

With this analysis, fan-out is traced until a cell or a module other than a logic gate, here, an FF21 is reached in the output direction from a terminal which outputs the clock signal in FIG. 7, namely, in the direction to a clock input terminal of the FF, and the partial circuit traced at that time is recognized as a clock tree CT.

In FIG. 7, the partial circuit, which is configured by the path which transmits the signal x, an AND gate 22, and a path which connects an output f of the AND gate 22 to the clock terminal of the FF21, is a clock tree. The other input to the AND gate, namely, a path which transmits g1 is not included in the clock tree CT.

In step S33, a logic variable g1 is assigned to the root of the clock tree CT, the clock terminal in FIG. 7, and an output terminal of a node other than the CT, namely, a terminal of a partial circuit 23 which outputs g1, and a calculation of a logic function in a leaf of the CT, namely, the clock input terminal to the FF is made.

In FIG. 7, only one FF exists, and the number of leaves of the CT is only one. Generally, however, a plurality of FFs exist within a circuit C. Therefore, the calculation of the logic function in the clock input terminal is made for all of FFs in step S33. The logic function calculated here becomes the following equation for FIG. 7.

$$f = x \cdot g1$$

Then, in step S34, a set A of FFs whose clock input terminals are connected to the leaves of the clock tree CT is obtained. In FIG. 7, this set A includes only one FF21 as an element.

In step S35, it is determined whether or not the set A is empty. If the set A is not empty, one FF is extracted from the set A in step S36, and defined as FFi. Then, in step S37, executed is a process for determining the clock signal as a positive phase clock if the logic function f in the leaf of the clock tree CT depends on the signal x from the clock terminal as the logic variable at the root of the tree, namely, if x is included unchanged, or for determining the clock signal as a reverse phase clock if the logic function f depends on x', namely, an inversion signal of x, that is, if x' is included. In step S38, a logic function F which represents a condition where a gated clock is enabled is obtained in correspondence with a result of the determination.

That is, in step S38, the logic function F is obtained with the following equation in correspondence with the positive phase clock and the reverse phase clock by using the value of f when x within the logic function f is set to 1, or a value obtained by inverting the value of f when x is set to 0. In the following equation, * indicates multiplication.

In case of the positive phase clock $$F = f|x \leftarrow 1 * (f|x \leftarrow 0)'$$

In case of the reverse phase clock $$F = f|x \leftarrow 0 * (f|x \leftarrow 1)'$$

In FIG. 7, since the logic function f depends on x, it is determined to be the positive phase clock in step S37. In step S38, the value of f when 1 is substituted for x in the equation for the positive phase clock becomes g1, whereas the value of f when 0 is substituted for x, namely, the inversion value of 0 becomes 1. Therefore, the value of F results in g1.

In step S39 of FIG. 6, a logic circuit calculating this logic function F is generated, and an input of the circuit is connected to a corresponding terminal within the circuit C, and an output of the generated circuit is defined as an enable signal ENgated to the FFi. Then, the processes in and after step S35 are repeated, and the process is terminated when the set A is determined to be empty in step S35.

Figure 8:
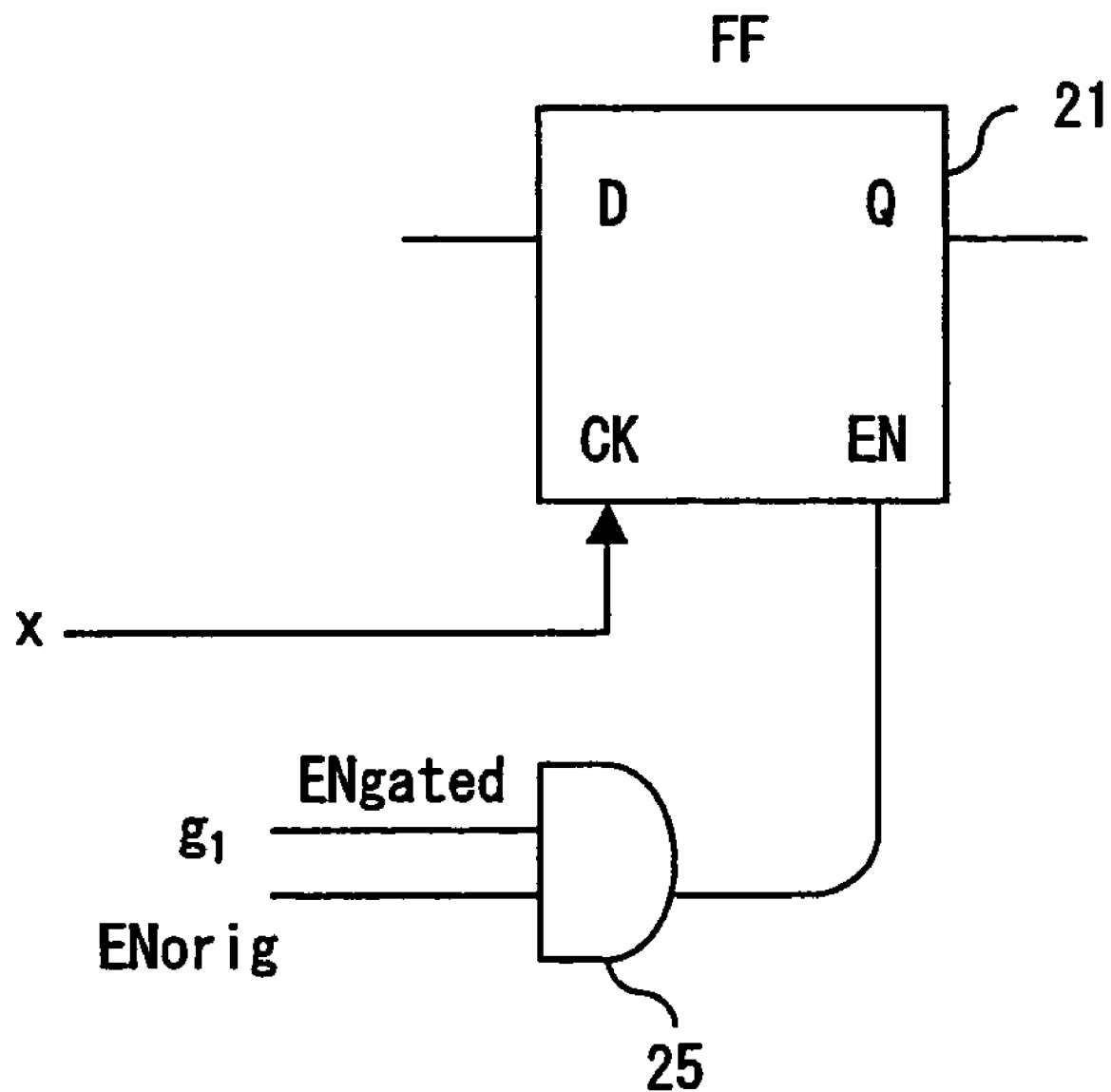
FIG. 8 shows a result of the circuit conversion shown in FIG. 7.

FIG. 8 shows the circuit generated in step S39 in correspondence with FIG. 7. In this circuit, the output of the circuit generating F, namely, g1 is defined as ENgated unchanged and input to an AND gate 25 along with the original enable signal ENorig, and an output of the AND gate 25 is input to an enable terminal of the FF21. In the meantime, the signal x from the clock terminal is input to the clock terminal unchanged.

The process goes back to FIG. 5. Then, in step S14, the timing condition E is converted into a restriction circuit for the external terminal, and added to the circuit C. By way of example, for the condition where the value of the external input B does not change during 5 clocks from when the value of the external input A changes, a counter which is reset to 0 at a time next to the time when the value of the external input A changes, increments its value up to 5, and holds that value thereafter is generated, and a circuit which externally stores a value in the external input B only when the value of the counter is 5 is added.

Figure 9:
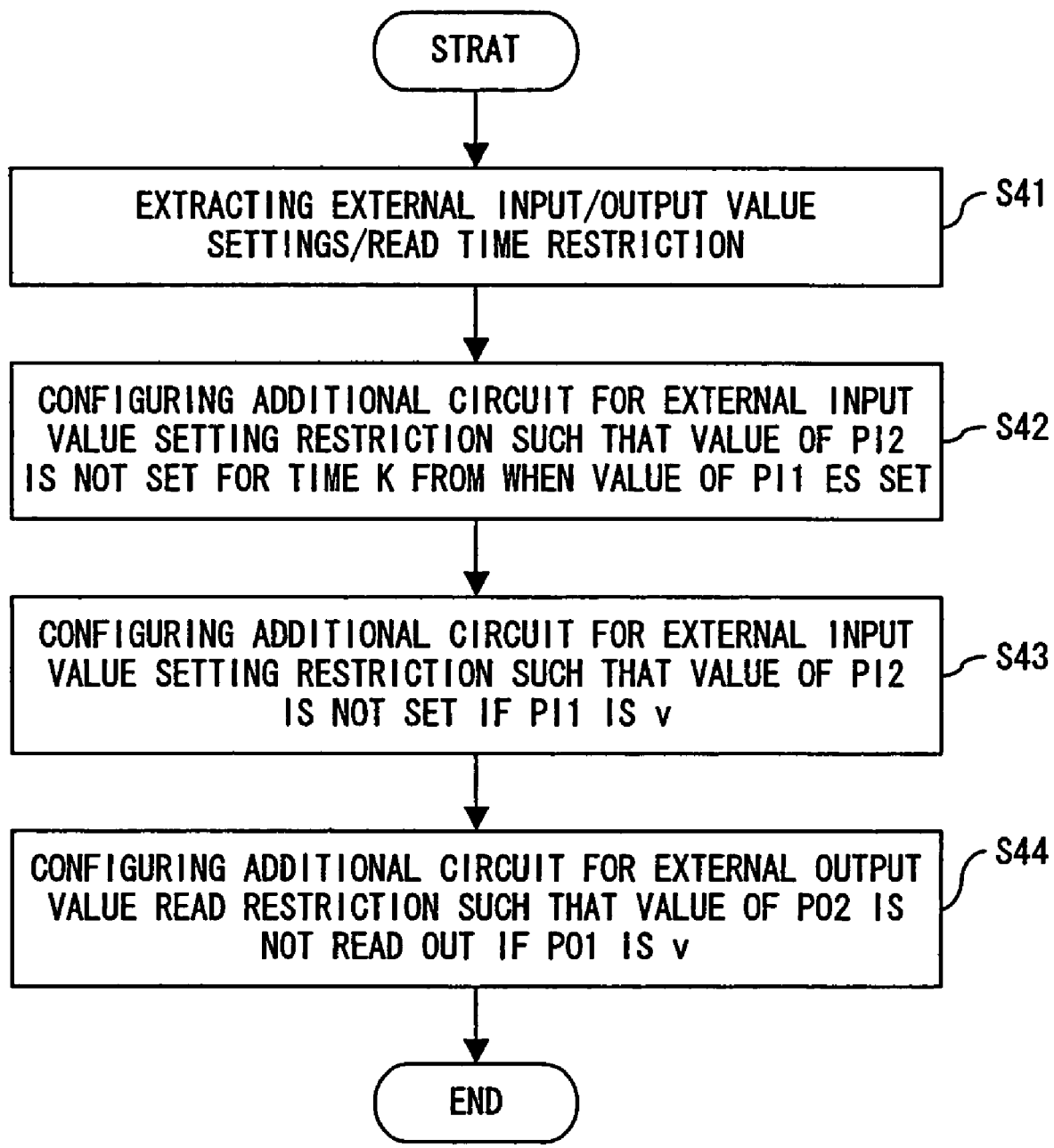
FIG. 9 is a flowchart showing the details of a process for performing conversion of a timing condition of an external terminal into a restriction circuit.

FIG. 9 is a flowchart showing the details of the process in step S14. Once the process is started in this figure, an external input value setting/read time restriction is first extracted, for example, from a memory in step S41. This restriction corresponds to the timing condition E of the external terminal, which is input in step S12 of FIG. 5.

Then, in step S42, an additional circuit shown in FIG. 10 is configured for the value setting restriction for an external input, namely, a restriction such that a value is not set for an input PI2 for a time K from when the value of an input PI1 is set. This restriction corresponds to a time delay in the giving of corresponding data to the PI2, for example, if an address is externally specified as the PI1.

In FIG. 10, a circuit using an FF31 and an XOR 32, and a circuit using an FF33 and a selector 34 are respectively added to external input terminals PI1 and PI2.

In FIG. 10, if the value of an external input signal PI2 changes, for example, from 0 to 1, this value is given to the external input terminal PI1, and also input to a data input to the FF31 and either of inputs of the XOR 32. At this time, the output of the FF31 is the former value of the PI1, namely, 0, and the output X of the XOR 32 becomes 1 at the time point when the PI1 changes from 0 to 1, for example, at a time t.

Therefore, a relationship which gives, as the following equation, a selection control signal C to the selector 34 connected to the input side of the external input terminal PI2 is stored, for example, in a memory in correspondence with $X(t)=1$, and used for a calculation at and after the time t.

$$X(t) = 1 \rightarrow C(t+1) = 0$$
$$C(t+2) = 0$$
$$C(t+K) = 0$$

Such a stored relationship is used, whereby the value of the selection control signal C to the selector 34 becomes 0 from a time t+1 until a time t+K regardless of the value of the external input PI2. Additionally, the selector 34 selects the data input 0, namely, the output of the FF33, whereby the value of the external input PI2 is not set from the time t+1 until the time t+K.

The process goes back to FIG. 9. In step S43, an additional circuit is configured for the next external input value setting restriction such that "the value of the PI2 is not set if PI1=v" in step S43. Here, v maybe either 0 or 1. An example of the additional circuit when v is 0 is shown in FIG. 11.

Figure 11:
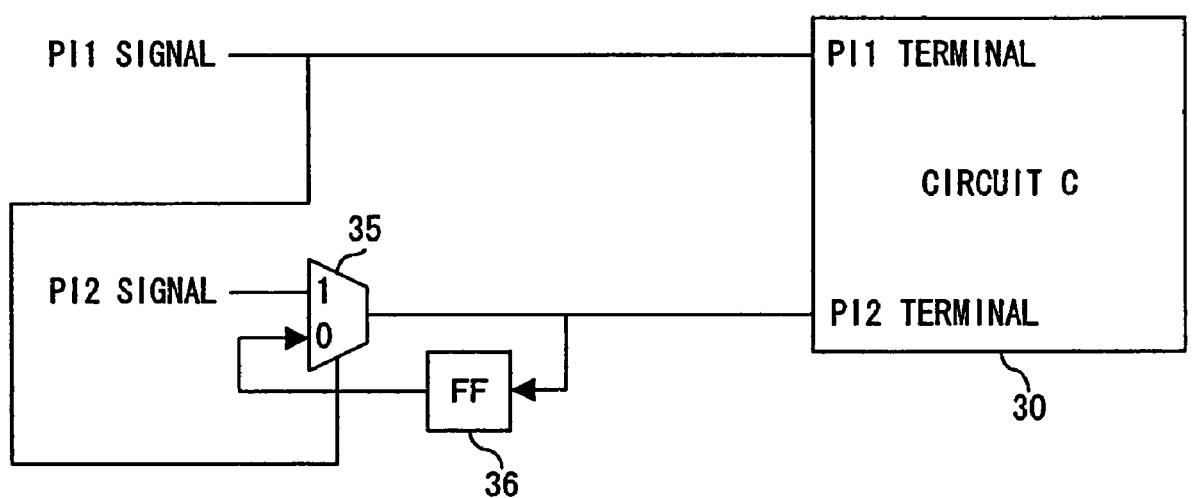
FIG. 11 explains a specific example (No. 2) of the conversion into the restriction circuit in FIG. 9.

In FIG. 11, a circuit configured by a selector 35 and a flip-flop 36 is added before the input terminal PI2. If the external input PI1 is 0, the selector 35 selects the output of the FF36. At this time, the formerly set value of the PI2, for example, 0 is stored in the FF36, and the formerly set value, for example, 0 is always output as the output of the FF36 to the external input terminal PI2. Even if a new value is attempted to be externally set as the PI2, that value is not set as long as the PI1 is 0.

FIG. 12 shows an example of the additional circuit in the case where v is set to, for example, 0 in the external output value read restriction such that the value of the PO2 is not read out if the PO1 is v, again in step S44 of FIG. 9.

In FIG. 12, a circuit configured by a selector 37 and an FF38 is added to the output side of an external output terminal PO2. If the external output PO1 is 0, the selector 37 outputs, for example, 0 as the value of the FF38, namely, the formerly read value of the PO2. Even if the value of the PO2 is attempted to be externally read out, a new value cannot be read out. The new value of the PO2 cannot be externally read out until the PO1 changes to 1.

Then, the memory elements within the circuit C are classified into groups in step S15 of FIG. 5, and a reachable state of a finite state machine (FSM), which is represented by each of the groups, is counted up. In this process, the memory elements within the circuit C are classified into groups, for example, by names, and all of the states reachable from the initial state are counted up by recognizing respective groups as local FSMs, and that information is held.

Figure 13:
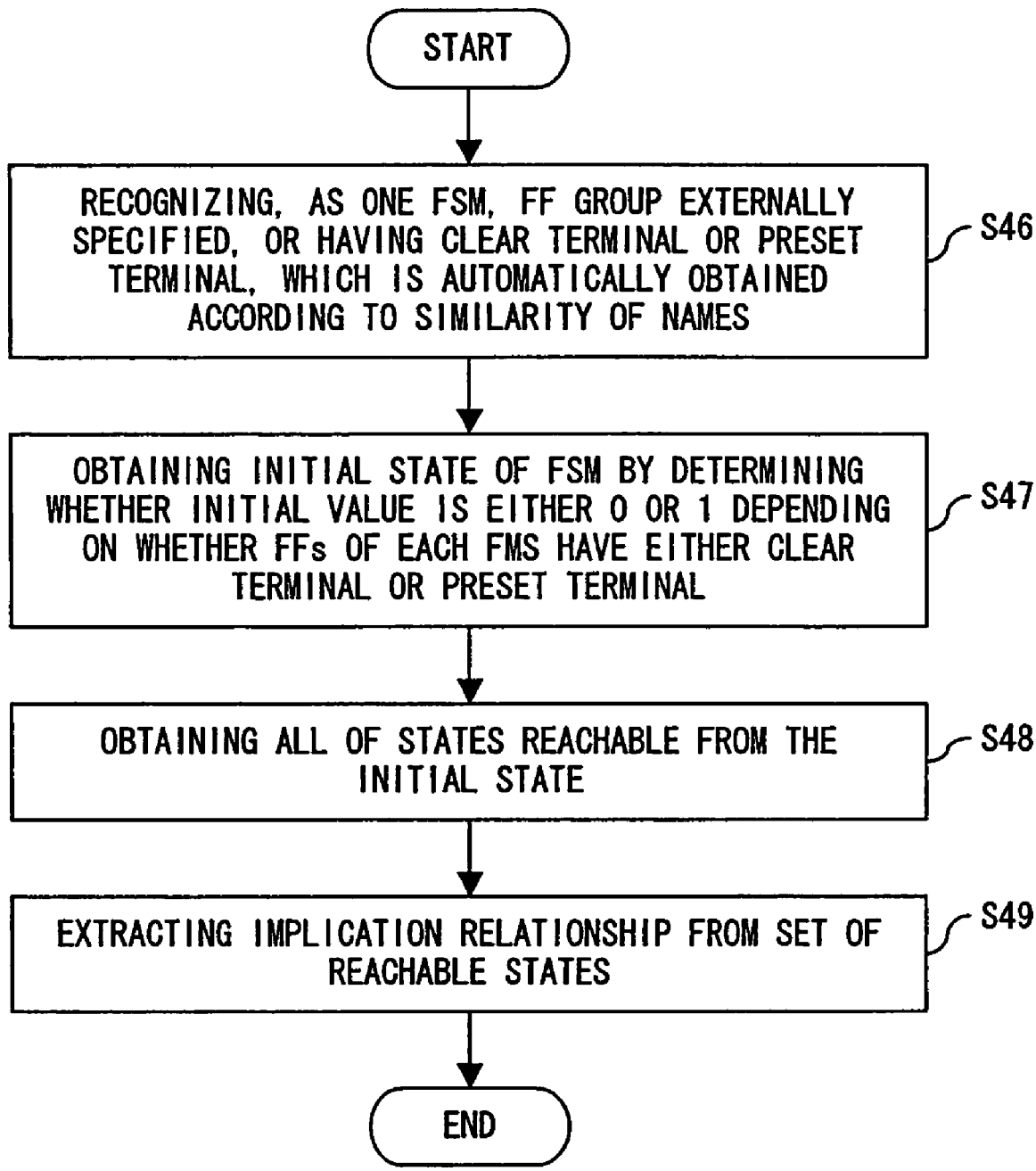
FIG. 13 is a flowchart showing the details of a process for counting up a reachable state of a finite state machine.

FIG. 13 is a flowchart showing the details of this process in step S15. This process is described with reference to FIG. 14.

Once the process is started in FIG. 13, a group having a clear terminal, or a group having a preset terminal is recognized as one FSM among groups which are externally specified or automatically obtained, for example, according to a similarity of names assigned to respective flip-flops.

By way of example, two FF groups both of which have a clear terminal and similar names such as FSM-REG-1 and FSM-REG-0 are recognized as one FMS. Since both of these groups have the clear terminal here, the initial state of this FMS becomes as follows by setting the clear input to 1.

(FSM-REG-1, FSM-REG-0)=(0, 0)

A process for obtaining this initial state is step S47. In step S47, the initial state of an FSM is obtained depending on whether each FFs of the FSM have either a clear terminal or a preset terminal. Namely, the initial value of FFs having the clear terminal is 0, whereas that of FFs having the preset terminal is 1.

Then, in step S48, all of states reachable from the initial state are obtained. FIG. 14 explains a state transition as a result of the state search. In this figure, states reachable from the initial state (0, 0) become as follows according to the configuration of the circuit C. It is proved that the transition cannot be made to a state (1, 0) according to the configuration state of the circuit C.

{00, 01, 11}

Then, an implication relationship is extracted from a set of the reachable states in step S49. The implication relationship indicates a unique relationship among the states extracted from a result of the state search. The following relationship is extracted as an example.

FSM-REG-1(t)=1→FSM-REG-1(t)=1

The process goes back to FIG. 5. In step S16, it is determined whether or not a set P of pairs of starting and end points is empty. Here, the set is not normally empty, and one pair of a starting point S and an end point T is extracted from the set P in step S17. A selection control input of the value setting control selector, which corresponds to the starting point S and the end point T, is converted into an enable signal for flip-flops at the starting point S and the end point T.

In this process, for example, if the selector is directly connected to a D input of the flip-flop at the starting point S, and if one of data inputs to the selector is equivalent to a Q output of the flip-flop, that selector is recognized as the value setting control selector for the starting point S, and an output obtained by performing an AND operation between the selection control input of the selector and the enable signal to the flip-flop is reconnected to the enable input of the flip-flop. A similar process is executed also for the flip-flop at the end point T.

Figure 15:
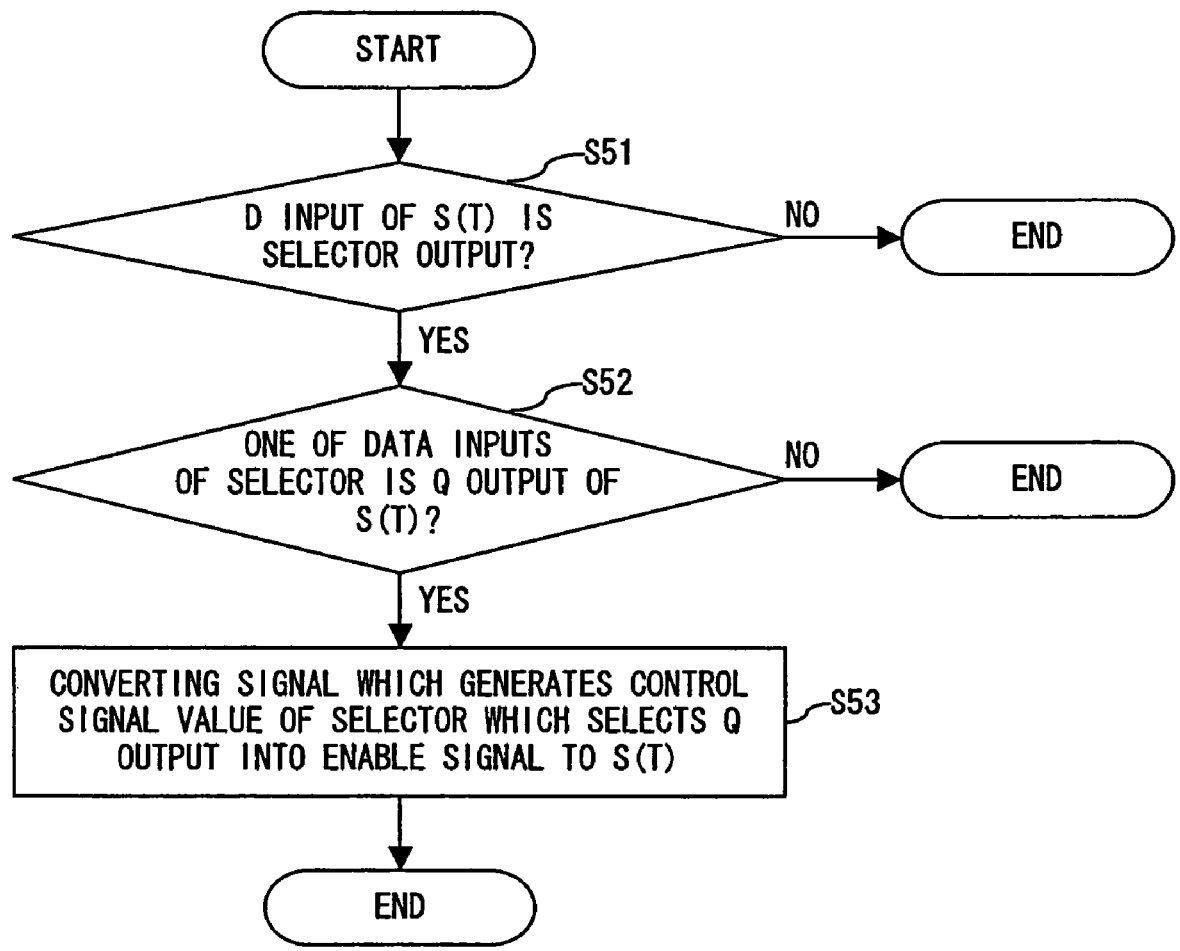
FIG. 15 is a flowchart showing the details of a process for converting a selection control input of a selector into an enable signal.

FIG. 15 is a flowchart showing the details of the conversion process in step S18. In this figure, the process for the end point T is again executed, for example, after the entire process for the starting point S is completed.

Once the process is started, it is determined in step S51 whether or not the D input to the flip-flop at the starting point is the output of the selector. If the D input is not the output of the selector, the process is immediately terminated. Namely, if the D input is not the output of the selector, the D input to the flip-flop is given, for example, from an AND gate or an OR gate other than the selector, and there is no need to convert a control input of the selector. Therefore, the process is immediately terminated.

If the D input is the output of the selector, it is determined in step S52 whether or not one of the data inputs to the selector is the Q output of the flip-flop. Also if the D input is not the Q output, it is determined that there is no need to convert the selection control input into an enable signal for that selector, and the process is immediately terminated.

If the data input is the Q output, a signal from a circuit which generates a selection control input signal value for selecting the Q output of the flip-flop is converted into an enable signal to the flip-flop at the starting point S as the input data to the selector in step S53, and the process is terminated.

Figure 16:
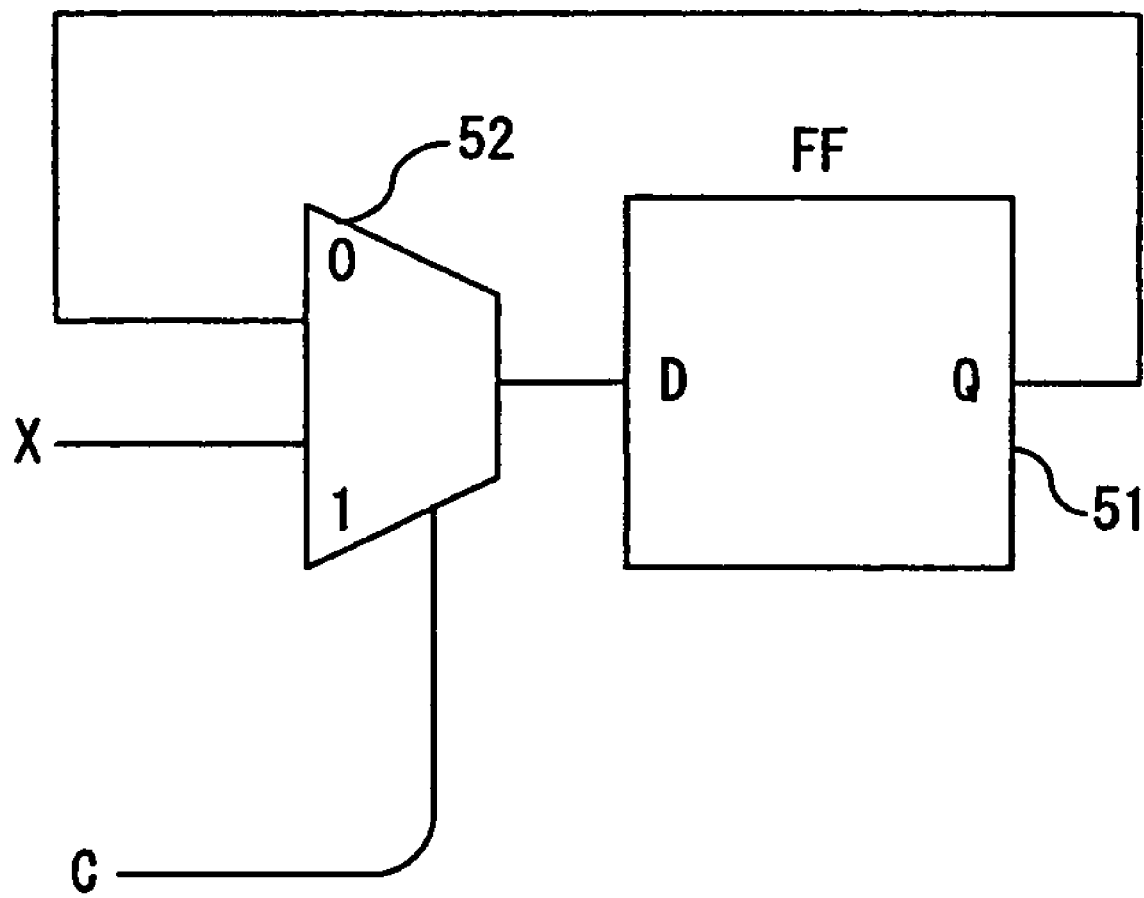
FIG. 16 explains a specific example of the conversion process shown in FIG. 15.

FIG. 16 explains the process in step S53. In this figure, an output of a selector 52 is given, for example, to a D input of a flip-flop 51 at the starting point S, and a Q output of the FF51 is connected to a data input terminal 0 of the selector 52. In this circuit, the output of the FF51 is selected and given to the D input of the FF51 if the selection control signal C to the selector 52 is 0. In the meantime, a signal X corresponding to an external input is given to the D input if the signal C becomes 1. Accordingly, this signal C plays a role of an enable signal to the FF if the selector 52 does not exist, and the external signal X is directly given to the D input of the FF51, so that the signal C can be connected to an enable terminal of the FF unchanged.

As described above, after the process shown in FIG. 15 is terminated for the starting point S, this process is executed for the end point T, and a selection control signal of the selector for the flip-flop at the end point T is converted into an enable signal.

The process again goes back to step S19 of FIG. 5, and a multi-cycle path determination is started. Firstly, in step S19, it is determined whether or not the memory element at the end point T is disabled at a time next to the time when the memory element at the starting point S is enabled.

Namely, if the memory element at the end point T is enabled and its value can possibly change at a time next to the time when the memory element at the starting point S is enabled and its value can possibly change, there is a possibility that the value stored in the memory element at the starting point S needs to reach the memory element at the end point T in one cycle. Therefore, it cannot be said that the path between S and T is a multi-cycle path.

If there is no such possibility, and if the memory element at the end point T is disabled at the next time, the value stored in the memory element at the starting point S does not need to reach the memory element at the end point T in one cycle. Therefore, that path is proved to be a multi-cycle path.

FIG. 17 explains a specific example of such a multi-cycle path. In this figure, FF1 and FF2 are respectively assumed to be memory elements at the starting point S and the end point T. It is determined whether or not a path in a combinatorial circuit part between the FF1 and the FF2 is a multi-cycle path. If an enable signal to the FF1 is 1 at a time t, both of the outputs of FF3 and FF4 are 0. The outputs of the FF3 and the FF4 respectively become 0 and 1 at the next time t+1, and an enable signal to the FF2 therefore becomes 0. Accordingly, the determination condition in step S19 is proved to be satisfied.

The process goes back to FIG. 5. If the end point T is disabled in step S19, that path is immediately determined to be a multi-cycle path in step S21. Then, the processes in and after step S16 are repeated.

In the meantime, if it cannot be definitely determined that the memory element at the end point T is disabled at the next time in step S19, whether or not the path is a multi-cycle path is determined by examining a path activation condition in step S20.

Namely, in this process, whether or not all of the paths from the starting point S to the end point T are inactive at the time when the memory element at the staring point is enabled, namely, whether or not a change in the value at the starting point S propagates to the end point T is examined by using a path activation condition to be described later. If all of the paths are determined to be inactive, that path is determined to be a multi-cycle path in step S21, and the processes in and after step S16 are repeated. If all of the paths are determined not to be inactive, and at least one of them is active, the process immediately goes back to step S16.

Figure 18:
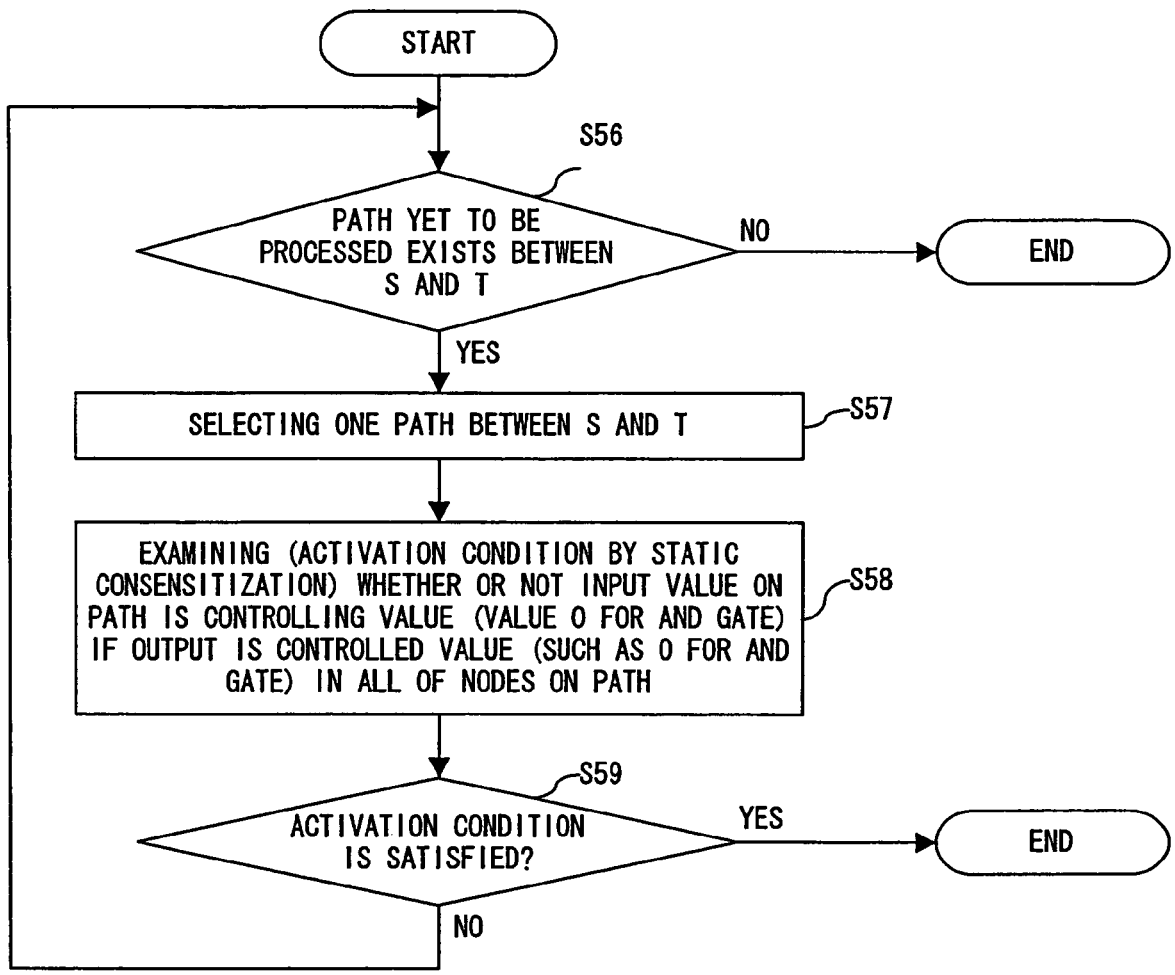
FIG. 18 is a flowchart showing the details of a process for determining an activation condition of all of the paths between a starting point and an end point.

FIG. 18 is a flowchart showing the details of the determination process in step S20. Once the process is started in this figure, it is determined in step S56 whether or not a path yet to be processed between the starting point S and the end point T exists. If such paths exist, one of them is selected in step S57, and examined by using, for example, a static cosensitization condition as an activation condition in step S58. This condition is referred to by the following document.

S. Davadas, et al., Logic Synthesis, P. 239, McGraw-Hill, 1994

The static cosensitization condition is briefly described. For example, if an AND gate exists on a path, a condition such that a controlled value as its output is 0, and the value of an input on the path among inputs to the AND gate must be 0 as a controlling value is given. Namely, a signal from a different path is given as a different input to the AND gate. However, if the value of an input on the path is 0, the output becomes 0 irrespective of the value of an input from a different path, and an activation condition is satisfied for the AND gate on that path.

For example, if the controlled value for an OR gate is 1, and the value of an input on a path is 1 as a controlling value, an activation condition is satisfied for the OR gate.

If an activation condition is satisfied for all of the nodes (gates and cells) on the path, the activation condition is determined to be satisfied in step S59, and the process is terminated. However, if the activation condition is not satisfied, the processes in and after step S56 are repeated for a path yet to be processed, and the process is terminated when no path yet to be processed is determined to exist.

If the set P of pairs of starting and end points is determined to be empty in step S16 of FIG. 5, a multi-cycle path on which a memory element exists between the memory elements at the starting and the end points, namely, a multi-cycle path which straddles the memory element is targeted, and a multi-cycle path whose cycle number exceeds the number of cycles (the number of straddled memory elements +1) is detected in step S22.

If such a multi-cycle path is detected, movability indicating whether or not a multi-cycle path restriction, which is specified, by way of example, for one partial path at the time of design, can move to a different partial path among respective partial paths between the memory elements on the multi-cycle path is output in step S23, and the process is terminated.

Figure 19:
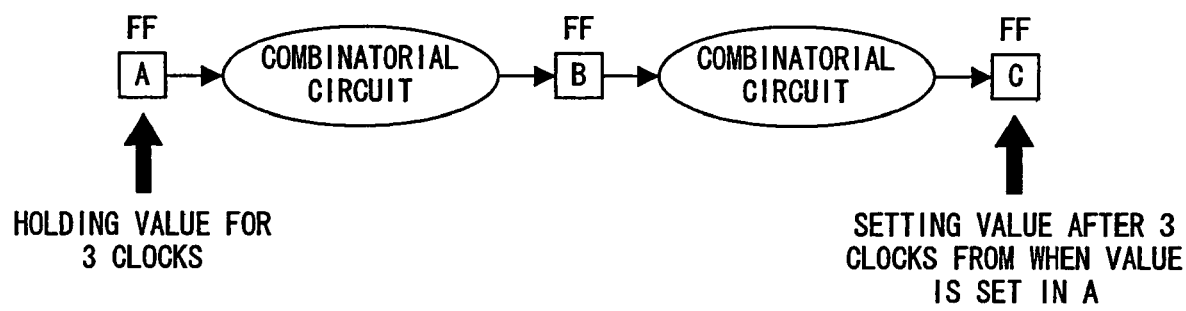
FIG. 19 explains a specific example of the process for determining the movability of a multi-cycle path.

FIG. 19 explains a specific example of a multi-cycle path on which the movability of a multi-cycle path restriction is examined. This figure shows part of the circuit C, and assumes that FFA holds a value until 3 clocks elapse from when the value is set, FFB stores a value input from the FFA via a combinatorial circuit in each clock, and FFC stores a value input from the FFB via a combinatorial circuit after 3 clocks elapse from when the value is set in the FFA.

Therefore, a path between the FFA and the FFC, which straddles the FFB, is a multi-cycle path of 3 cycles. However, since only one FFB exists on this multi-cycle path, either the path between the FFA and the FFB or the path between the FFB and the FFC can be set as a 2-cycle path. For example, if a restriction which defines the path between the FFA and the FFB as a multi-cycle path of 2 cycles is input at the time of design, this multi-cycle path can be considered to be moved between the FFB and the FFC.

Figure 20:
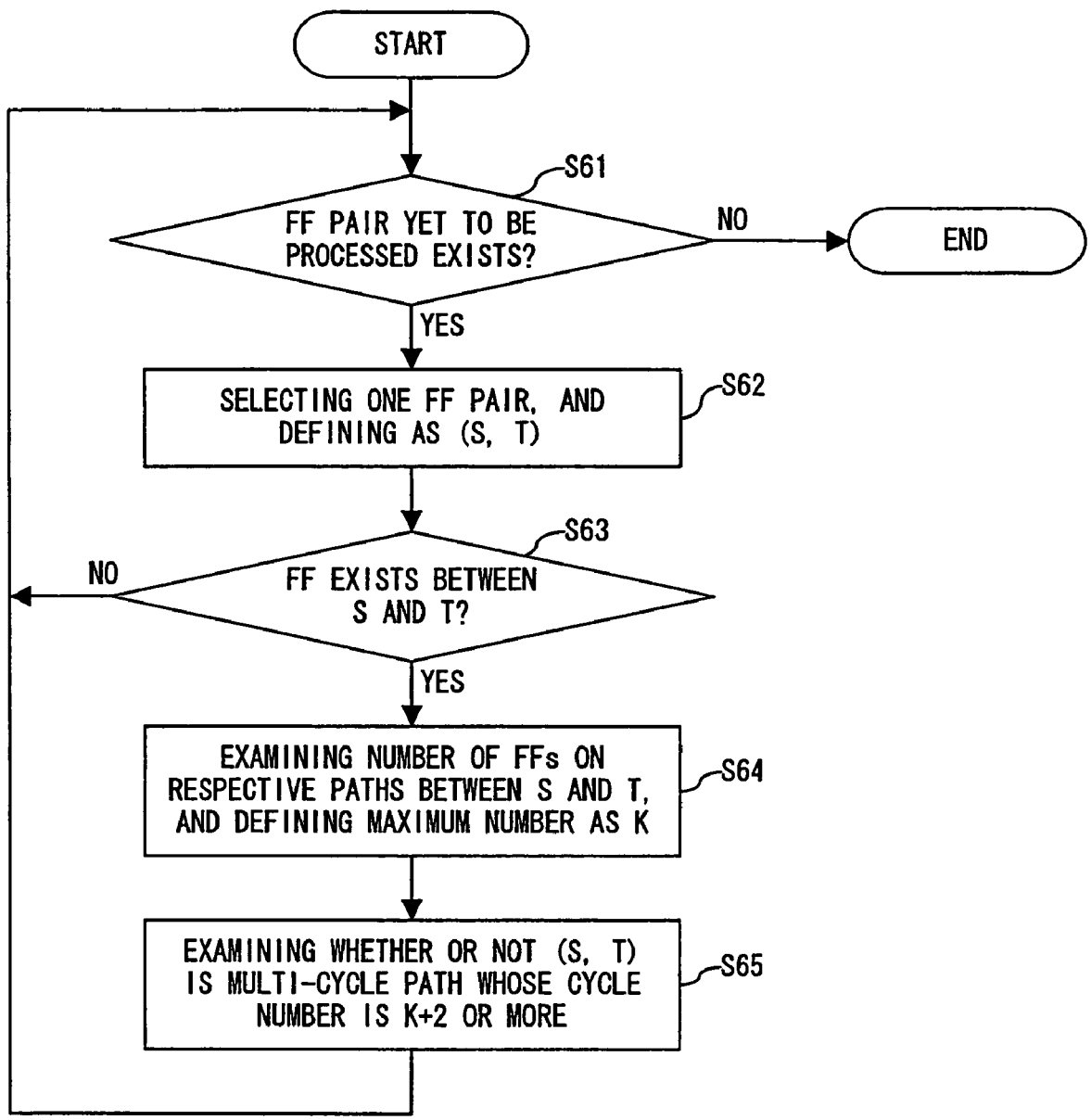
FIG. 20 is a flowchart showing the details of the process for determining the movability of a multi-cycle path.

FIG. 20 is a flowchart showing the details of step S22 of FIG. 5, namely, the process for detecting a multi-cycle path that exceeds the number of cycles (the number of straddled memory elements +1). In this figure, processes in steps S61 to S65 are executed for all of combinations of FFS within the circuit C, namely, the FF pairs.

Once the process is started, it is determined in step S61 whether or not an FF pair yet to be processed exists. If FF pairs yet to be processed exist, one of them is selected, and its starting and end points are respectively defined as S and T in step S62. In step S63, it is determined whether or not an FF exists between the starting and the end points, namely, whether or not a path between the FFs of the selected pair straddles a memory element. If the path does not straddle a memory element, the processes in and after step S61 are repeated.

If the path straddles a memory element, the numbers of FFs respectively existing on paths which exist in a parallel manner between the starting point S and the end point T are examined, and their maximum number is defined as K in step S64. In step S65, it is examined whether or not a path which straddles the FFs the number of which is the maximum number K is a multi-cycle path whose cycle number is (K+2) or more. If the path is a multi-cycle path whose cycle number is (K+2) or more, this path is determined to be a multi-cycle path that has movability. Then, the processes in and after step S61 are repeated. The process is terminated when no FF pair yet to be processed is determined to exist in step S61.

In the process for examining whether or not a path is a multi-cycle path of (K+2) cycles or more, the processes in steps S19 and S20 of FIG. 5 can be executed by recognizing that a straddled FF is removed from a path.

By using the above described information of the movability of a multi-cycle path, the multi-cycle path can be moved according to variations in a product delay after a circuit is manufactured, and a timing restriction can be also changed for each product. Additionally, only step S22 of FIG. 5 is applied to a path which is already proved to be a multi-cycle path, and only its movability can be examined.

The above provided description refers to the detection of a multi-cycle path whose cycle number is two or more by assuming that the fundamental number of cycles is 2. However, an analysis of a multi-cycle path whose cycle number is K can be normally made by examining whether or not a memory element at an end point is enabled in a range from a time next to a time when the value of a memory element at a starting point of the path can possibly change, namely, the time when the memory element at the starting point is enabled, until a (K−1) time from a current time, in a similar manner as in the description provided for step S65 of FIG. 20. Additionally, the above provided description refers to the preferred embodiment in the form where, for example, a gated clock and an enable input of a memory element of a clock source are converted into signals to an actual enable terminal of a flip-flop as a circuit. However, also considered is a preferred embodiment where such information is held, for example, in a memory, and used for the determinations by referencing this information in steps S19 and S20 of FIG. 5.

Such information may be held in a memory for the conversion of a condition for an external terminal into a restriction circuit in step S14 of FIG. 5, or for the conversion of a selection control input of a selector into an enable signal in step S18, and the determinations can be made by referencing this information in steps S19 and S20. Furthermore, for a large-scale circuit, troublesomeness of examining all of paths in step S20 becomes very high. Therefore, the process in step S20 can be omitted.

As described above, according to the present invention, a change in values of memory elements at starting and end points of a path are determined according to a value of an enable signal. This eliminates the need for extracting a condition where the value changes by analyzing the logic of a circuit. Additionally, by using information of a cell within a circuit, such as a selection control input of a selector, and information of reachability of a local finite state machine, an analysis of a multi-cycle path can be made faster, and an analysis ability can be improved.

Furthermore, since a timing restriction can be satisfied more easily by analyzing the movability of a multi-cycle path without needing the troublesomeness of a designer. As a result, a design time can be reduced. Still further, a result of a movability analysis is applied to an operation for changing a timing restriction according to variations in a delay of a circuit after being manufactured, thereby improving a yield of the product. This greatly contributes to improvements in practicability of a multi-cycle path analysis.

What is claimed is:

1. A multi-cycle path analyzing method making an analysis of a multi-cycle path which can take two cycles or more for a signal to propagate from a starting point of the path to its end point among paths within a circuit to be analyzed, comprising:

making an analysis of a circuit to be analyzed in correspondence with a name of each element which includes a cell configuring the circuit to be analyzed, and/or a meaning and/or a relationship of a signal to a terminal of each element; and making a multi-cycle path determination of whether or not a path from a starting point to an end point is a multi-cycle path by using a result of the analysis, and wherein in the analysis of the circuit to be analyzed, circuit conversion for a multi-cycle path analysis in correspondence with the meaning of the signal to the terminal of each element is performed; and the multi-cycle path determination is made by using a result of the circuit conversion, and wherein in the circuit conversion, circuit conversion such that a signal which can be converted into an enable signal to memory elements at the starting point and the end point of the path among signals to the terminal of the element is performed.

2. The multi-cycle path analyzing method according to claim 1, wherein
in the multi-cycle path determination, multi-cycle path determination is made depending on whether or not a value of the memory element possibly change based on a value of the enable signal to the memory elements at the starting point and the end point of the path.

3. The multi-cycle path analyzing method according to claim 2, wherein
the path is determined to be a multi-cycle path if the end point of the path is disabled at a time next to the time when the starting point of the path is enabled, or if all of the paths between the starting point and the end point of the path are inactive, in the multi-cycle path determination made based on the value of the enable signal.

4. The multi-cycle path analyzing method according to claim 1, wherein in the circuit conversion, circuit conversion such that a selection control signal to a selector which controls a setting of a value in the memory element at the starting point and/or the end point is converted into the enable signal is performed.

5. The multi-cycle path analyzing method according to claim 1, wherein in the circuit conversion, if a source of a clock which drives the memory element at the starting point and/or the end point is also the memory element, circuit conversion such that the enable signal for the memory element of the clock source is converted into the enable signal for the memory element at the starting point and/or the end point is performed.

6. The multi-cycle path analyzing method according to claim 1, wherein in the circuit conversion, circuit conversion such that a clock which drives the memory elements is converted into the enable signal by using clock gating information of a clock which drives the memory elements at the starting point and the end point of the path is performed.

7. The multi-cycle path analyzing method according to claim 1, wherein:
in the analysis of the circuit to be analyzed, memory elements within the circuit are classified into groups by the name of each element;
a reachable state of a finite state machine represented by each of the groups is calculated; and
the multi-cycle path determination is made by using a result of the calculation.

8. The multi-cycle path analyzing method according to claim 1, wherein
in the analysis of the circuit to be analyzed, a restriction circuit corresponding to a condition is added to the circuit to be analyzed based on the condition for a relationship between a value setting signal for an external input terminal of the circuit and a value read signal from an external output terminal; and
the multi-cycle path determination is made for the circuit to be analyzed after the addition.

9. The multi-cycle path analyzing method according to claim 1, wherein the path between which memory elements the multi-cycle path restriction can move to is detected between the starting point and the end point of the path based on the result of the multi-cycle path analysis.

10. The multi-cycle path analyzing method according to claim 1, wherein:
in the analysis of the circuit to be analyzed, information required for circuit conversion for the multi-cycle path analysis is stored in correspondence with the meaning of the signal to the terminal of each element which includes a cell configuring the circuit; and
the multi-cycle path determination is made by using stored contents.

11. A multi-cycle path analyzing apparatus making an analysis of a multi-cycle path which can take two cycles or more for a signal to propagate from a starting point of the path to its end point among paths within a circuit to be analyzed, comprising:
a circuit converting unit performing circuit conversion for making a multi-cycle path analysis in correspondence with a meaning of a signal to a terminal of each element which includes a cell configuring the circuit; and
a multi-cycle path determining unit making a determination of a path from a starting point to an end point is a multi-cycle path by using a result of the circuit conversion, and
wherein said circuit converting unit performs circuit conversion such that a signal which can be converted into an enable signal for memory elements at the starting point and the end point of the path among signals for the terminal of the element into the enable signal.

12. A program, which is used by a computer making an analysis of a multi-cycle path which can take two cycles or more for a signal to propagate from a starting of the path to its end point among paths within a circuit to be analyzed, for causing the computer to execute a process, the process comprising:
performing circuit conversion for making an analysis of a multi-cycle path in correspondence with a meaning of a signal to a terminal of each element which includes a cell configuring the circuit;
making a determination of whether or not a path from a starting point to an end point is a multi-cycle path by using a result of the circuit conversion; and
said circuit converting unit performs circuit conversion such that the signal which is converted into an enable signal for memory elements at the starting point and the end point of the path among signals for the terminal of the element into the enable signal.

* * * * *